(12) United States Patent
Kumamoto (10) Patent No.: US 6,703,859 B2
(45) Date of Patent: Mar. 9, 2004

(54) PROGRAMMABLE LOGIC DEVICE AND METHOD OF CONTROLLING CLOCK SIGNAL THEREOF

(75) Inventor: Norichika Kumamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 47 days.

(21) Appl. No.: 10/107,073

(22) Filed: Mar. 28, 2002

(65) Prior Publication Data

US 2003/0107400 A1 Jun. 12, 2003

(30) Foreign Application Priority Data

Dec. 7, 2001 (JP) ........................ 2001-374670

(51) Int. Cl.$^7$ ........................ G06F 7/38; H03K 19/177
(52) U.S. Cl. ........................ 326/38; 326/41; 327/293
(58) Field of Search ........................ 326/38, 40, 41, 326/46, 93; 327/292, 293

(56) References Cited

U.S. PATENT DOCUMENTS

| | | | | |
|---|---|---|---|---|
| 5,537,057 A | * | 7/1996 | Leong et al. | 326/41 |
| 5,923,188 A | * | 7/1999 | Kametani et al. | 326/93 |
| 6,020,774 A | * | 2/2000 | Chiu et al. | 327/295 |
| 6,177,844 B1 | * | 1/2001 | Sung et al. | 331/25 |

* cited by examiner

*Primary Examiner*—Daniel Chang
(74) *Attorney, Agent, or Firm*—Arent Fox Kintner Plotkin & Kahn, PLLC

(57) ABSTRACT

An object of the present invention is to provide a programmable logic device which intends to reduce electric power consumption or heat generation sufficiently as a whole device while preventing a clock skew from being generated and retaining a processing speed of the device. To this end, according to the present invention, there is provided a device including logic blocks for carrying out logical operation, lines for connecting the logic blocks, line-changing means for changing the state of lines connecting the logic blocks by programming, a clock net for supplying a clock signal to each of the logic blocks, and clock control means for dynamically controlling switching between a clock signal supply mode and a clock signal stop mode for each logic block so that at least one non-active logic block of the logic blocks can be stopped from being supplied with the clock signal.

18 Claims, 6 Drawing Sheets

RELATED ART

PROGRAMMABLE LOGIC DEVICE AND METHOD OF CONTROLLING CLOCK SIGNAL THEREOF

BACKGROUND OF THE INVENTION

1) Field of the Invention

The present invention relates to a programmable logic device suitable for use as a logic device such as an FPGA (Field Programmable Gate Array), a CPLD (Complex programmable Logic Device) in which the function thereof can be changed in accordance with a program. The present invention also relates to a method of controlling a clock signal supplied to the programmable logic device.

2) Description of the Related Art

A programmable logic device represented by a device such as an FPGA or CPLD is a logic device of which operation can be changed in accordance with a program. The programmable logic device has an advantageous nature that makes it possible to handle various kind of problems such as specification change of the product which will be brought about at an early stage of product development. For this reason, recently, technology of the logic device is rapidly developed.

Since the logic device tends to suffer from restriction when a desired circuit scale is realized or when operation speed thereof is to be increase, the programmable logic device is frequently utilized as a trial manufacture of an LSI (Large Scale Integration) at a stage of experiment and development. However owing to the recent development of device technology, allowable circuit scale is enlarged and the operation speed is increased, with the result that the logic device becomes more and more utilized practically. In particular, the logic device is frequently utilized in a part of system serving as an interface with an external system where it is difficult to construct the part of system with a microprocessor unit or a digital signal processor.

However, when the logic device is applied to a system such as a mobile communication terminal or a portable telephone, a rate of power consumption is a decisive factor, in addition to the operation speed and the circuit scale, upon selecting a device. When a programmable logic device is designed in a conventional manner, since the circuit size or the operation speed is regarded as a priority factor, the rate of power consumption has not reached a satisfactory level as compared with an LSI designed for a specific use.

In general, when the device of the rate of power consumption is large, the generated heat amount also is increased. This heat amount will influence upon the circuit operation of the device. For example, if a system employing the device is one provided outdoors which can be supplied with electric power from a power supply, the problem of power consumption reduction will not be a serious problem for such a system as compared with the above-described system such as a mobile communication terminal. However, if the device is employed in the system such as a mobile communication terminal, to suppress the heat generation due to the electric power consumption becomes a more important factor.

That is, if a circuit device having a high heat generating nature is employed in a system, a cooling device is requested for guaranteeing the operation of the circuit, which leads to a cost increase in the system. Thus, when a programmable logic device is applied to the above-described system, in order to guarantee a proper circuit operation, it is requested to employ a circuit device having a properly suppressed heat generating nature in the system upon designing the system.

Figure 8:
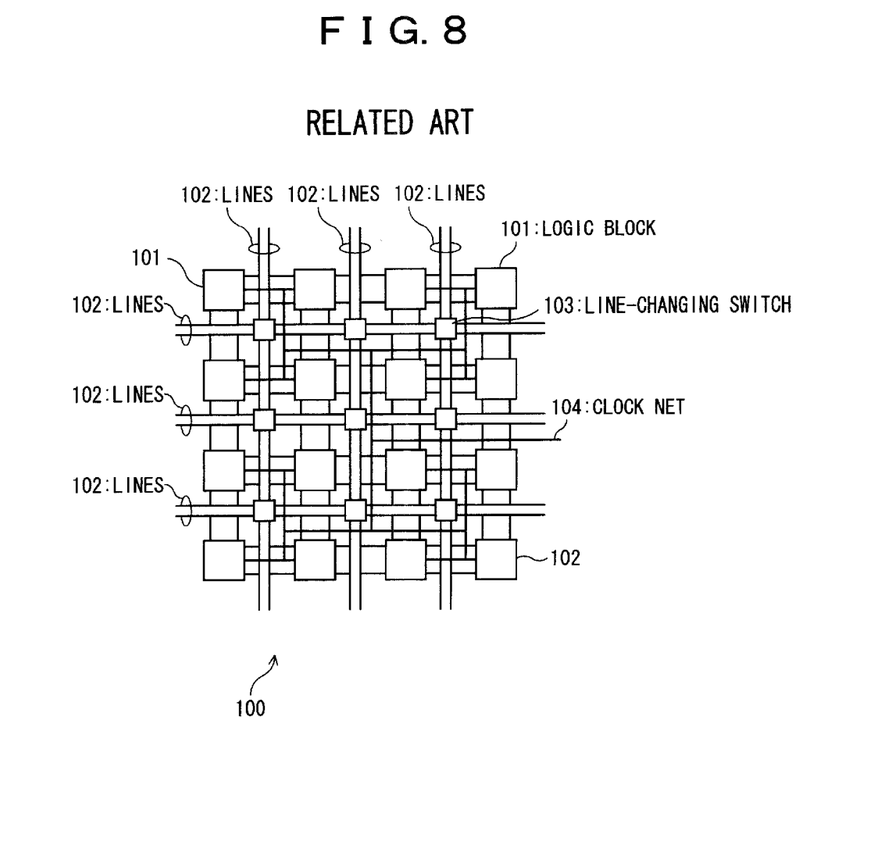
FIG. 8 is a circuit diagram showing a part of an FPGA as an example of a conventional programmable logic device.

FIG. 8 is a circuit diagram showing a part of an FPGA as an example of a conventional programmable logic device. As shown in FIG. 8, an FPGA 100 is arranged to include a plurality (there are shown 16 blocks in FIG. 8) of logic blocks (CLB:Configuration Logic Block) 101 arrayed in a matrix fashion, lines 102 extended to form a grid, line-changing switches 103 provided at respective intersecting points of the lines 102 extended to form a grid, and a clock net 104 for delivering a clock signal to the logic blocks 101.

The wiring 102 connect each of the logic blocks 101 one another. The line-changing switch 103 is a unit for changing the connection relation through the lines 102 by programming. The connection relation among the logic blocks 101 can be changed by the switching of the line-changing switch 103. Thus, a function implemented by the circuit can be changed in accordance with the program. The clock net 104 is provided independently of the lines 102 which connect the logic blocks 101 one another. In other words, the clock net 104 is ordinarily not connected to the lines 102.

Meanwhile, the logic block 101 is made up with integrated circuit elements such as flip-flops constituting a sequential circuit and AND gates, OR gates and so on for realizing logic operation. In particular, if the flip-flop function within the logic block 101 is constructed by a CMOS (Complementary Metal Oxide Semiconductor), electric power consumed by the flip-flop circuit portion will be increased. Therefore, if the electric power consumed at the flip-flop circuit portion can be successfully suppressed, then electric power consumption in the whole FPGA can be remarkably reduced.

If an enable terminal is provided at the flip-flop circuit portion within the above-described logic block 101, a signal can be supplied to the enable terminal so that the flip-flop operation can be controlled in switching between the enable mode and the disable mode in synchronism with the clock signal. However, the clock signal itself is inevitably delivered to the flip-flop circuit portion even if the flip-flop circuit portion is brought into the disable mode. Therefore, the electric power will be uselessly consumed at the flip-flop circuit portion due to the clock signal which is inevitably supplied to the flip-flop circuit portion during the disable mode.

For this reason, if electric power consumption is suppressed in the programmable logic device such as the FPGA described with reference to FIG. 8, it is desirable for the signal to be prevented from being delivered in the logic block 101 at the flip-flop circuit portion thereof when the flip-flop circuit portion is brought into the disable mode. Further, in order to prevent the clock signal from being delivered in the logic block 101 at the flip-flop circuit portion thereof when the flip-flop circuit portion is brought into the disable mode, the following two circuit arrangement strategies can be employed.

① First strategy: the flip-flop circuit portion thereof is replaced with a flip-flop element having no enable terminal in the logic block 101 shown in FIG. 8. Further, the logic block 101 is provided with a gate so that a clock signal input to the flip-flop element can be controlled in accordance with an enable signal.

② Second strategy: the function as the clock net 104 is assembled together with the lines 102 so that lines as the clock net can be changed in accordance with the desired type of the logic device. In this way, halting of clock signal supply can be controlled in a manner similar to that of the other logic device components. In more concretely, the clock signal supply itself through the lines 102 can be stopped by using the ordinary logic block 101.

However, if the logic device employs the above-introduced two strategies for preventing the clock signal from being supplied to the logic block 101 at the flip-flop circuit portion thereof upon the disable mode, the logic device will encounter the following difficulties.

Initially, in the first strategies identified by reference ①, although the electric power consumption brought about in the flip-flop circuit portion can be decreased, it will be difficult to arrange the wiring for supplying the clock signal to each of the logic blocks, which fact can lead to a clock skew. Thus, another buffer shall be inserted into the clock net for adjusting the clock skew. However, this buffer element will also consume electric power. To decrease the power consumption at the buffer element is additional task from the circuit design standpoint. Therefore, it is difficult to decrease the electric power consumption or heat generation of the entire device.

Further, in the first strategy identified by reference ②, it is true that electric power consumption at the flip-flop circuit portion can be decreased in the logic block. However, since the clock net is composed of a variable line, similarly to the above-case, it is necessary to insert a buffer element in the device for adjusting the clock skew. In this case, there is a fear that a considerable amount of the amount of logic circuit elements and lines tend to become idle, and hence utility of the components can be decreased. Thus, and it becomes difficult to keep the processing speed of the whole device at a high speed.

SUMMARY OF THE INVENTION

The present invention is made in view of the above aspect. Therefore, it is an object of the present invention to provide a programmable logic device which intends to reduce electric power consumption or heat generation sufficiently as a whole device while preventing a clock skew from being brought about and retaining a processing speed of the device. Further object of the present invention is to propose a method of controlling such a programmable logic device.

In order to attain the above object, according to the present invention, there is provided a programmable logic device including a plurality of logic blocks for carrying out logical operation, lines for connecting the logic blocks to one another, line-changing means for changing the state of lines connecting the logic blocks to one another by programming, a clock net for supplying a clock signal for controlling an operation timing to each of the logic blocks, the clock net being provided independently of the lines, and clock control means for dynamically controlling switching between a clock signal supply mode and a clock signal stop mode for each logic block so that at least one non-active logic block any of the logic blocks, which shifts from an active state to a non-active state, can be stopped from being supplied with the clock signal.

In more preferably, the clock control means is composed of a plurality of switching units, provided on the clock net, for switching between the clock signal supply mode and the clock signal stop mode.

Further, each of the switching units is provided on a clock supply line constituting the clock net at a point just behind a branch of the clock supply line as viewed from the upstream side of the clock supply stream. Also, when at least one of the plurality of switching units, which is stopped from being supplied with the clock signal, exists and at least one of the plurality of switching units exists on a downstream side of the switch unit in the clock signal stop mode, the switching unit on the downstream side is placed in the clock signal supply mode.

Further, the clock control means may be arranged to carry out switching between the clock signal supply mode and the clock signal stop mode in accordance with a control signal supplied from a predetermined one of the plurality of logic blocks. In this case, it is more preferable that the clock control means is arranged to receive the control signal through the lines and the line-changing means.

Further, the clock control means may be arranged to carry out switching between the clock signal supply mode and the clock signal stop mode in accordance with a control signal supplied from a predetermined one of the plurality of logic blocks. In this case, it is more preferable that the clock control means is arranged to receive the control signal through the lines and the line-changing means.

Each of the switching units may be arranged to have an AND gate which creates a logical product of the control signal and the clock signal and outputs the product to the side of the logic block. Each of the switching units may be arranged to have an OR gate which creates a logical add of the control signal and the clock signal and outputs the add to the side of the logic block. Alternatively, each of the switching units may be arranged to have a latch which effects a latching action in response to the control signal and the clock signal and an AND gate which creates a logical product of an output of the latch and the clock signal and outputs the product to the side of the logic block.

Further, each of the switching units may be arranged to have a latch which effects a latching action in response to the control signal and the clock signal and an OR gate which creates a logical add of an output of the latch and the clock signal and outputs the add to the side of the logic block.

Further, at least one of the plurality of switching units, which is disposed within an area of a downstream side of the clock net, may be arranged to have an AND gate or an OR gate which generates a logical product or a logical add of the control signal and the clock signal and outputs the product or the add to the side of the logic block, and at least one of the plurality of switching units, which is disposed within an area of an upstream side of the clock net, may be arranged to have a latch which effects a latching action in accordance with the control signal and the clock signal and an AND gate or an OR gate which generates a logical product or a logical add of an output of the latch and the clock signal and supplies the product or the add to the side of the logic block.

Further, each of the logic blocks may be arranged to include an element which operates in synchronism with the clock signal.

Further, according to the present invention, there is proposed a method of controlling a clock signal to be supplied to a programmable logic device comprising a plurality of logic blocks for carrying out logical operation, lines for connecting the logic blocks to one another, line-changing means for changing the state of wiring connecting the logic blocks to one another by programming, and a clock net for supplying a clock signal for controlling an operation timing to each of the logic blocks, the clock net being provided independently of the lines, the method including steps of outputting a control signal for halting a clock signal supply to at least one non-active logic block of the plurality of logic blocks which shifts from an active state to a non-active state, and halting the clock signal supply to the non-active logic block at a point just behind a branch of the clock supply line as viewed from the upstream side of the clock supply stream, in accordance with the control signal which is generated at the step of outputting the control signal.

When the above method is effected, an FPGA (Field Programmable Gate Array) or a CPLD (Complex Programmable Logic Device) is employed as the programmable logic device.

Therefore, according to the programmable logic device of the present invention, the clock control means dynamically control each of the logic blocks in the switching between the clock signal supply mode and the clock signal stop mode so that the clock signal is prohibited from being supplied to any logic block of the plurality of logic blocks placed in the non-active state. Accordingly, electric power consumption or heat generation as the whole circuit arrangement can be decreased.

Further, according to the arrangement of the present invention, the plurality of switching units are disposed just behind the corresponding branch point of the clock supply line forming the clocknet. Therefore, this arrangement of the clock supply line is free from a problem of clock signal skew, and components including an existing buffer disposed on the clock net can be properly controlled in switching between the clock signal supply mode and clock signal stop mode. Furthermore, according to the arrangement of the present invention, the control signal for each switching circuit is supplied from a corresponding logic block through the wiring. Therefore, each logic block can be controlled in switching between the clock supply mode and clock stop mode depending on the state of operation of the logic block. Thus, each logic block can be controlled with ease and large freedom will be brought into a situation of designing the property of control.

Moreover, according to the arrangement of the present invention, if there is any switching circuit on the downstream side with respect to a switching circuit which is set to the clock supply stop mode, the switching circuit disposed on the downstream side is inevitably set to the clock signal supply mode. Therefore, a control signal of an active state may be supplied to only the upstream side switching circuit which governs all of the logic blocks which are desired to be set to the clock signal stop mode. Accordingly, a plurality of logic blocks disposed on the downstream side can be collectively controlled in their clock control by providing a single supply of control signal, the switching circuits disposed on the downstream side need not be supplied with a control signal which brings the switching circuit into the active state, and hence the control becomes easy, and a number of circuit elements necessary for clock control can be decreased.

DESCRIPTION OF THE PREFERRED EMBODIMENTS

[1] Description of First Embodiment of Present Invention

Embodiments of the present invention will be hereinafter described with reference to drawings.

Figure 1:
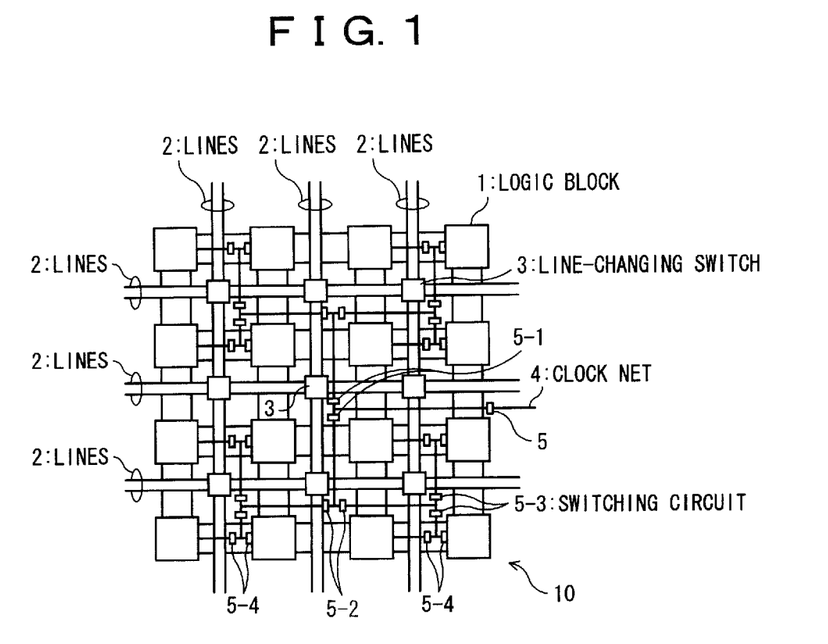
FIG. 1 is a circuit diagram showing a part of an FPGA as a programmable logic device according to a first embodiment of the present invention.

FIG. 1 is a circuit diagram showing a part of an FPGA as a programmable logic device according to a first embodiment of the present invention. As shown in FIG. 1, similarly to that shown in FIG. 8, an FPGA 10 is arranged to include a plurality (there are shown 16 blocks in FIG. 1) of arrayed logic blocks 1 for carrying out logical operation, lines 2 for connecting the logic blocks to one another, line-changing switches 3 as line-changing means for changing the state of changing (connection state) among the respective logic blocks through the lines 2 by programming.

Each of the logic blocks 1 is arranged to include elements such as flip-flops and so on which are operable in synchronism with a clock signal. The operation of the logic block 1 itself can be changed by programming. The lines 2 are composed of a plurality of lines extending in the longitudinal direction and the lateral direction across the logic blocks so that the lines form a grid. Although not shown, the lines 2 establish an electrical connection to a programmable logic device which serves as an input/output terminal for connecting with an external electric wiring. Reference numeral 4 represents a clock net which is provided fixedly so as to be independent of the lines 2. A clock signal is supplied to each of the logic blocks 1 through to the clock net 4, whereby each of the logic blocks is controlled in its operation timing.

The arrangement of the clock net 4 will be more fully described. A single line of the clock net 4 has a branch arrangement of which number of branches corresponds to the number of logic blocks 1. Although not shown, a single unit of clock supply source is provided outside the device, and the clock signal is supplied from the clock supply source to each of the logic blocks 1 through the clock line having the branches. Thus, each of the logic blocks 1 can be supplied with the clock signal at the same phase. In other words, a route through which the clock signal is supplied from the clock supply source, not shown, to each of the logic blocks 1 can be uniquely determined by the clock net 4. Furthermore, the clock net 4 is composed of clock supply lines which extend from the clock supply source to the logic blocks 1, respectively, and each of the clock supply lines is arranged to have a substantially uniform length. Thus, a clock skew can be prevented from being brought about.

The clock net 4 is provided with a plurality of switching circuits 5, 5-1 to 5-4 serving as a switching unit, which will be described later on. That is, one end of the clock net 4 as a single channel of clock supply line is connected to the clock supply source and the other end of the same is branched at a number of stages (in the case of FIG. 1, four stages). On the clock supply line, the aforesaid switching circuits 5, 5-1 to 5-4 is provided at a point just behind each branch of the clock supply line (soon after the branching point of the clock supply line) as viewed from the upstream side of the clock supply stream.

Each of the plurality (in the case of FIG. 1, 31 units) of switching circuits 5, 5-1 to 5-4 is a unit for controlling the clock signal supply from the clock supply source in the switching between the clock signal supply mode and the clock signal stop mode. With these switching circuits 5, 5-1 to 5-4, when any one of the 16 logic blocks 1 is desired to stay in a non-active state (disable state), this block 1 can be stopped from being supplied with the clock signal. That is, these switching circuits 5, 5-1 to 5-4 function as clock control means for dynamically controlling each of the logic blocks 1 in switching between the clock signal supply mode and the clock signal stop mode.

For example, the switching circuit 5 illustrated at the middle portion in the vertical direction and the right end of the diagram of FIG. 1 is provided at the proximal end portion (clock supply source side) of the clock supply line forming the clock net 4. This switching circuit 5 can dynamically control the switching between the clock signal supply mode and the clock signal stop mode on all of the logic blocks 1 constituting the FPGA 10.

At the center portion of the diagram of FIG. 1, there are illustrated a couple of the switching circuits 5-1, one of them being illustrated on the upper side and the other of the same being illustrated on the lower side. The couple of switching circuits 5-1 are provided at points just behind the first stage branch of the clock supply line constituting the clock net 4. Of the couple of the switching circuits 5-1, the switching circuit 5-1 provided at the upper side controls a group of eight logic blocks 1 arrayed in the upper half of the circuit arrangement illustrated in FIG. 1 so that the clock signal supply is switched between the clock signal supply mode and the clock signal stop mode. Conversely, the switching circuit 5-1 provided at the lower side collectively controls a group of eight logic blocks 1 arrayed in the lower half of the circuit arrangement illustrated in FIG. 1 so that the clock signal supply is switched between the two modes.

In a similar manner, there are provided a couple of the switching circuits 5-2 at each point just behind a second stage branch of the clock supply line. For example, in the lower half of the circuit arrangement illustrated in FIG. 1, there are provided a couple of the switching circuits 5-2, one of them being illustrated on the right side and the other of the same being illustrated on the left side. The couple of switching circuits 5-2 are provided at points just behind the second stage branch of the clock supply line constituting the clock net 4. Of the couple of the switching circuits 5-2, the switching circuit 5-2 provided at the left side collectively controls a group of four logic blocks 1 arrayed in the left half of the circuit arrangement illustrated in FIG. 1 so that the clock signal supply is switched between the clock signal supply mode and the clock signal stop mode. Conversely, the switching circuit 5-2 provided at the right side collectively controls a group of four logic blocks 1 arrayed in the right half of the circuit arrangement so that the clock signal supply is switched between the two modes.

Further, there are provided a couple of the switching circuits 5-3 at each point just behind a third stage branch of the clock supply line. For example, in the lower right portion of the circuit arrangement illustrated in FIG. 1, there are provided a couple of the switching circuits 5-3, one of them being illustrated on the upper side and the other of the same being illustrated on the lower side. The couple of switching circuits 5-3 are provided at the point just behind the third stage branch of the clock supply line constituting the clock net 4. Of the couple of the switching circuits 5-3, the switching circuit 5-3 provided at the upper side collectively controls a couple of right side logic blocks 1 arrayed in the third row of the circuit arrangement illustrated in FIG. 1 so that the clock signal supply is switched between the clock signal supply mode and the clock signal stop mode. Conversely, the switching circuit 5-3 provided at the lower side collectively controls a couple of right side logic blocks 1 arrayed in the fourth row of the circuit arrangement so that the clock signal supply is switched between the two modes.

Furthermore, there are provided a couple of the switching circuits 5-4 at each point just behind a distal end portion, i.e., a fourth stage branch of the clock supply line. For example, in the lower right portion of the circuit arrangement illustrated in FIG. 1, there are provided a couple of the switching circuits 5-4, one of them being illustrated on the right side and the other of the same being illustrated on the left side. The couple of switching circuits 5-4 are provided at the point just behind the fourth stage branch of the clock supply line constituting the clock net 4. Of the couple of the switching circuits 5-4, the switching circuit 5-4 provided at the left side controls a second logic block 1 from the right end in the fourth row from the upper end of the circuit arrangement illustrated in FIG. 1 so that the clock signal supply is switched between the clock signal supply mode and the clock signal stop mode. Conversely, the switching circuit 5-4 provided at the right side controls a logic block 1 at the right end in the fourth row from the upper end of the circuit arrangement so that the clock signal supply is switched between the two modes.

Meanwhile, each of the above-described switching circuits 5, 5-1 to 5-4 receives a control signal from a predetermined one of the 16 logic blocks 1 through the lines 2 and the line-changing switch 3. Further, each of the above-described switching circuits 5, 5-1 to 5-4 controls the corresponding one of the logic blocks 1 in the switching between the clock signal supply mode and the clock signal stop mode in response to the control signal. As for example shown in FIG. 2, the switching circuits 5-3 and 5-4 receive a control signal from the aforesaid predetermined one of the 16 logic blocks 1 shown in FIG. 1 based on a switching setting effected by the wiring changing switch 3. In this way, the aforesaid switching is effected.

Figure 2:
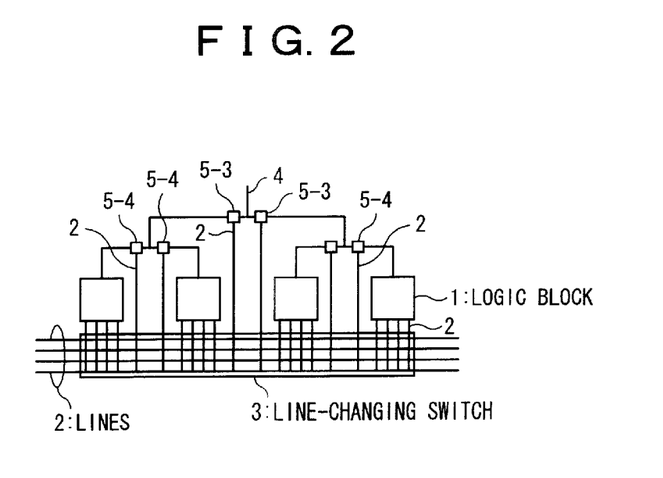
FIG. 2 is a circuit diagram showing a main portion of the FPGA shown in FIG. 1.

If one of the switching circuits is supplied with the control signal from the aforesaid logic block 1 and there is another switching circuit on the downstream side with respect to that switching circuit, the switching circuit disposed on the downstream side is forcibly placed in a clock signal supply mode.

The logic blocks 1 constituting the FPGA 10 are connected with a power supply line GND extended within the FPGA 10 so as to be independent of the clock net 4. Since the power supply line GND is placed in an active low control mode, the voltage thereof is set to GND. However, if the power supply line is placed in an active high control mode, the voltage thereof may be set to Vcc (e.g., Vcc>zero volt). A control signal to be supplied to the switching circuit on the downstream side may be formed of the signal obtained from the power supply line which is always placed in the active state. That is, if each switching circuit is supplied with the control signal from the power supply line at a point near the switching circuit, the wiring resources can be effectively utilized.

In more concretely, in the case of two switching circuits 5-3 shown in FIG. 2, if the right switching circuits 5-3 of the diagram is controlled in switching so that the clock signal is prevented from being supplied, then the two switching circuits 5-4 on the downstream side with respect to the switching circuit 5-3 (in this diagram, right two of the four switching circuits 5-4) are placed in the clock signal supply mode. Similar arrangement is applied to any other two switching circuits among the switching circuits 5, 5-1 to 5-4 so long as one of the two switching circuits is disposed on a downstream side with respect to the other.

There are many possible arrangements for providing the control signal for controlling the switching circuits 5, 5-1 to 5-4. For example, all of the switching circuits 5, 5-1 to 5-4 may not be supplied with the control signal from only a single logic block 1 but each of the switching circuits 5, 5-1 to 5-4 may be supplied with the control signal from a logic block 1 nearest to each of the switching circuits 5, 5-1 to 5-4. Although in the above case each of the switching circuits 5, 5-1 to 5-4 can be supplied with the control signal from a different logic block 1, a couple of switching circuits provided just behind the same branch stage may be supplied with the control signal from a common logic block 1. It is needless to say that all of the switching circuits 5, 5-1 to 5-4 may be supplied with the control signal from only a single logic block 1. Alternatively, the control signal supply unit may be provided outside the FPGA 10. In this way, any arrangement can be selected to seek an optimum circuit operation. The wiring for connecting the above-described switching circuits 5, 5-1, 5-4, the wiring changing switch 3 and the logic blocks 1 to one another may be settled based on a known scheme which is fundamentally equivalent to that of the wiring 2 for connecting the logic blocks 1.

Now, several possible examples for the above-described switching circuits 5, 5-1 to 5-4 will be hereinafter described in detail. That is, the switching circuits 5, 5-1 to 5-4 can be arranged based on any of the following four examples identified by references [1] to [4].

Figure 3A:
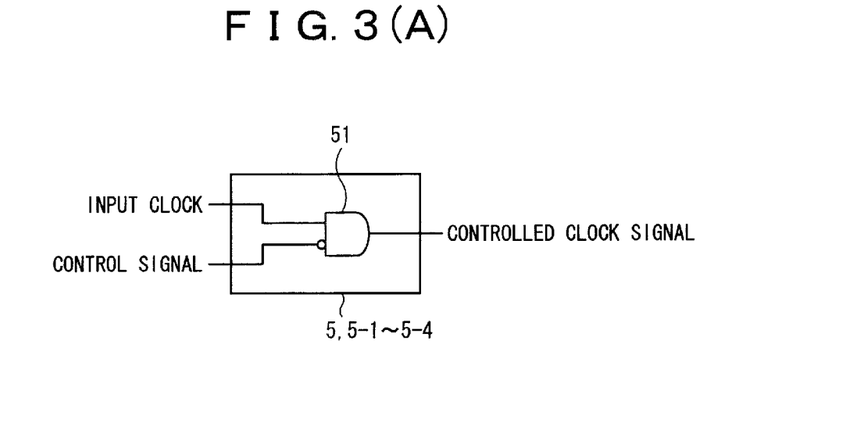
FIG. 3(A) is a circuit diagram showing a switching circuit as a first example.

[1] A first example is as follows. As for example shown in FIG. 3(A), each of the switching units 5, 5-1 to 5-4 is arranged to have an AND gate 51 which creates a logical product of an inverted input of the aforesaid control signal from the predetermined logic block 1 and the clock signal and supplies the product to the side of the logic block 1. In the case of FIG. 3(A), the control signal is inverted and inputted into the AND gate. Thus, the logic block 1 is brought into an Active High control mode in which when the control signal goes to 1 (high level), the clock signal supply is stopped. The control signal may not be inverted and inputted into the AND gate (i.e., the control signal is directly inputted). In this case, the logic block 1 is brought into an Active Low control mode in which when the control signal goes to 0 (low level), the clock signal supply is stopped.

Figure 4A:
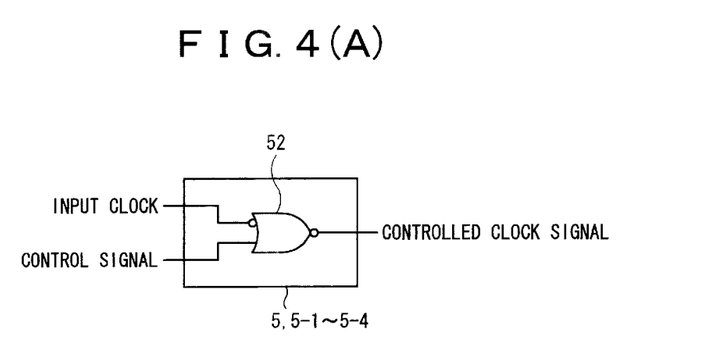
FIG. 4(A) is a circuit diagram showing a switching circuit as a second example.

[2] A second example is as follows. As for example shown in FIG. 4(A), each of the switching units 5, 5-1 to 5-4 is arranged to have an NOR gate 52 which creates a negation of a logical add of the aforesaid control signal from the predetermined logic block 1 and an inverted clock signal input and supplies the negation of the add to the side of the logic block 1 [see FIG. 4(A)].

Figure 5A:
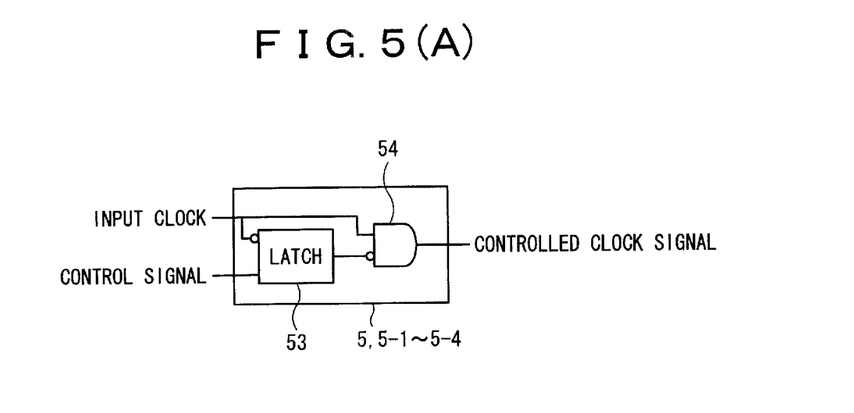
FIG. 5(A) is a circuit diagram showing a switching circuit as a third example.

[3] Each of the switching units 5, 5-1 to 5-4 may be arranged to have a latch 53 which effects a latching action in accordance with the aforesaid control signal from the predetermined logic block 1 and the clock signal and an AND gate 54 which creates a logical product of an inverted output of the latch 53 and the clock signal and supplies the product to the side of the logic block 1 [see FIG. 5(A)].

Figure 6A:
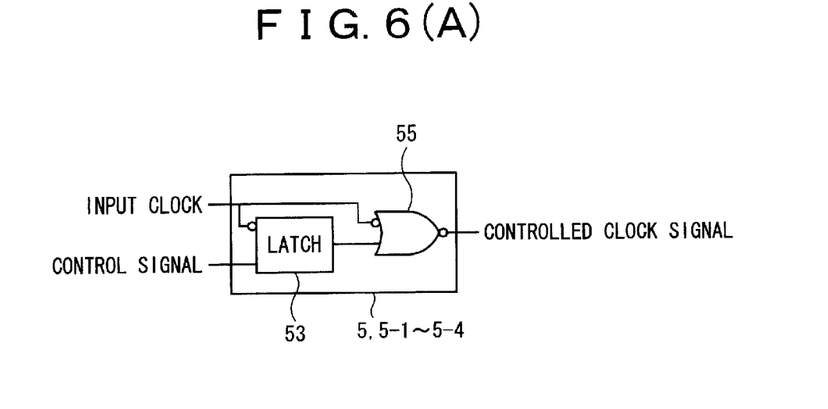
FIG. 6(A) is a circuit diagram showing a switching circuit as a fourth example.

[4] Each of the switching units 5, 5-1 to 5-4 may be arranged to have the latch 53 which effects a latching action in accordance with the control signal and the clock signal and an NOR gate 55 which creates a negation of a logical add of an output of the latch 53 and an inverted clock signal and supplies the add to the side of the logic block 1 [see FIG. 6(A)].

Figure 3B:
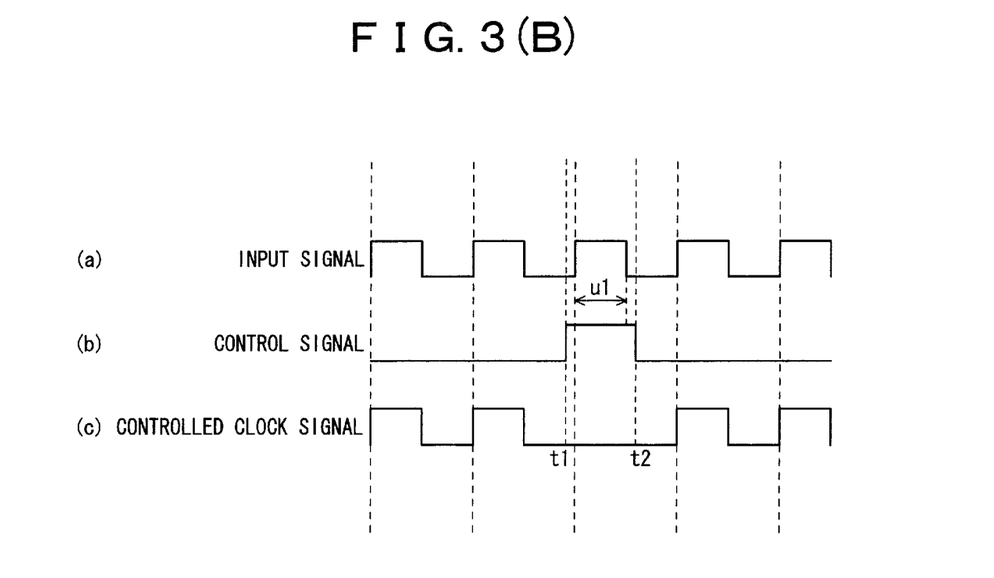
FIG. 3(B) is a timing chart for explaining an operation of the switching circuit as the first example.

When each of the switching units 5, 5-1 to 5-4 is constructed based on the aforesaid examples identified by numeral [1], the AND gate 51 creates a logical product of the clock signal supplied from the clock supply source not shown [input clock signal, see a waveform diagram shown at (a) in FIG. 3(B)] and the aforesaid inverted input of the control signal [see a waveform diagram shown at (b) in FIG. 3(B)]. Thus, a clock signal controlled in a desired manner [see a waveform diagram shown at (c) in FIG. 3(B)] can be generated. Accordingly, an active high control can be established in which when the control signal goes to 1 (high level) clock signal is stopped [see an interval between timing points t1 and t2 in the waveform diagrams shown at (a) to (c) in FIG. 3(B)]. In more specifically, when the control signal takes the high level (interval between timing point t1 and t2), i.e., a time duration of a half period of the clock signal, the clock signal can be stopped. Thus, the pulse of the input clock signal taking the high level during a time period u1 is prevented from being outputted.

Figure 4B:
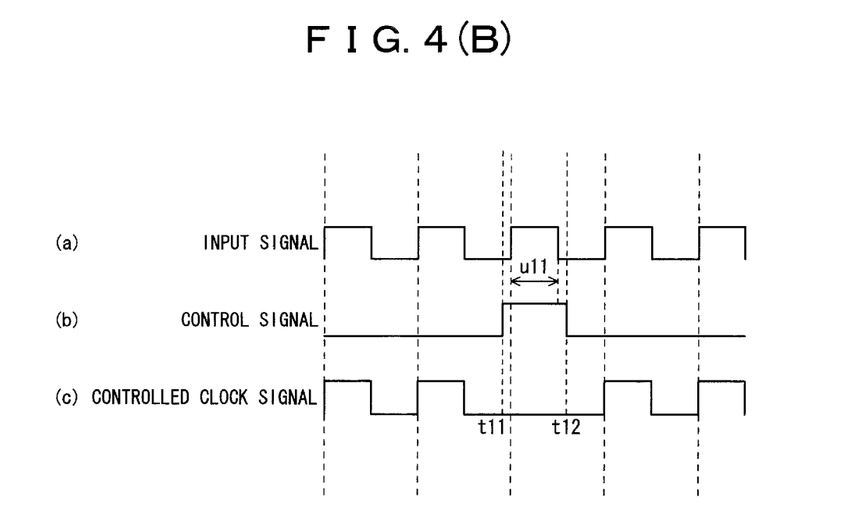
FIG. 4(B) is a timing chart for explaining an operation of the switching circuit as the second example.

When each of the switching units 5, 5-1 to 5-4 is constructed based on the aforesaid arrangement identified by the numeral [2], the NOR gate 52 creates a logical add of the inverted input clock signal [see a waveform diagram shown at (a) in FIG. 4(B)] and the aforesaid clock signal [see a waveform diagram shown at (b) in FIG. 4(B)], and then generates the resultant inverted signal. Thus, the output clock signal can be controlled in a desired manner [see a waveform diagram shown at (c) in FIG. 4(B)]. In this way, similarly to the case of [1], when the control signal takes the high level (the interval between timing points t11 and t12), the clock signal supply can be stopped, and hence the pulse of the input clock signal taking the high level a during time period u11 is prevented from being outputted.

Figure 5B:
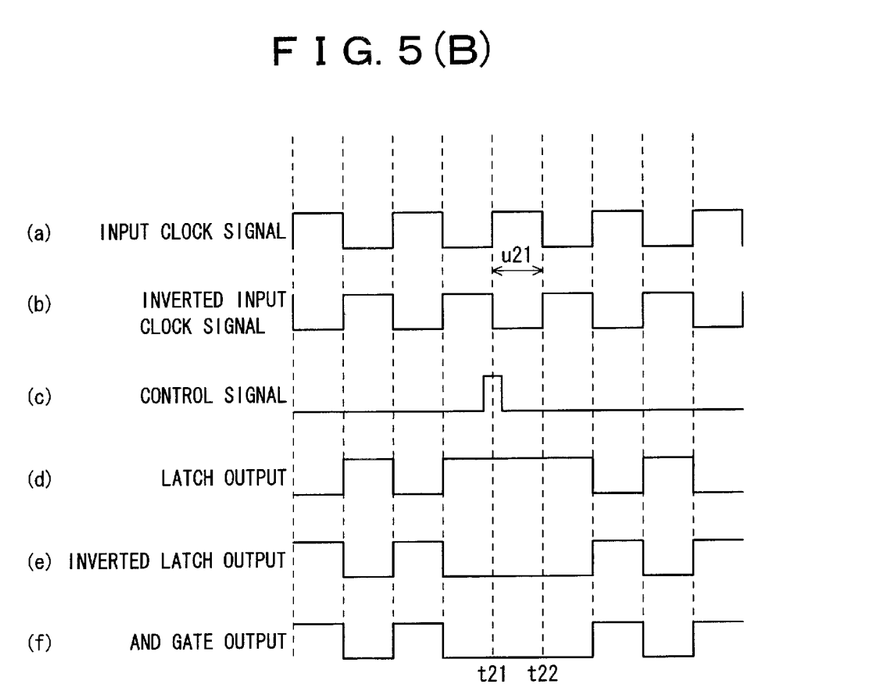
FIG. 5(B) is a timing chart for explaining an operation of the switching circuit as the third example.

When each of the switching units 5, 5-1 to 5-4 is constructed based on the aforesaid arrangement identified by the numeral [3], the latch 53 inverts the input clock signal [see waveform diagrams shown at (a) and (b) in FIG. 5(B)]. The latch 53 is also supplied with the control signal [see a waveform diagram shown at (c) in FIG. 5(B)] and generates a signal which stops a falling edge of the inverted input clock signal at a timing when the clock signal is desired to be stopped [see an interval between timing points t21 and t22 in a waveform diagram shown at (d) in FIG. 5(B)]. In this case, the control signal is a signal going to 1 when the clock pulse has a rising edge upon a time interval u21 during which the clock signal is desired to be stopped [see a waveform diagram shown at (a) in FIG. 5(B)]. The control signal is a signal staying in 0 otherwise.

The AND gate 54 creates a logical product of the aforesaid input clock signal and the inverted signal from the latch 53 [see a waveform diagram shown at (e) in FIG. 5(B)]. Thus, the output clock signal can be controlled in a desired manner [see a waveform diagram shown at (f) in FIG. 5(B)]. In this way, similarly to the case of [1], when the control signal goes to the high level to designate an interval (the interval between timing points t21 and t22), the clock signal supply can be stopped, with the result that the pulse of the input clock signal taking the high level during a time period u21 is prevented from being outputted.

Figure 6B:
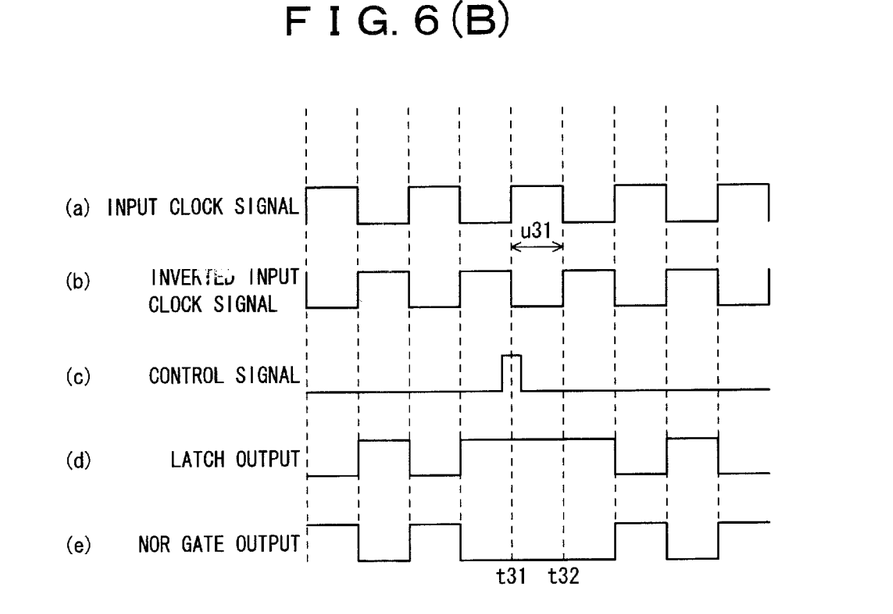
FIG. 6(B) is a timing chart for explaining an operation of the switching circuit as the fourth example.

When each of the switching units 5, 5-1 to 5-4 is constructed based on the aforesaid arrangement identified by the numeral [4], the latch 53 inverts the input clock signal [see waveform diagrams shown at (a) and (b) in FIG. 6(B)]. The latch 53 is also supplied with the control signal [see a waveform diagram shown at (c) in FIG. 6(B)] and generates a signal which stops a falling edge of the inverted input clock signal at a timing when the clock signal is desired to be stopped [see an interval between timing points t31 and t32 in a waveform diagram shown at (d) in FIG. 6(B)]. In this case, similarly to the above-described case of FIG. 5(B), the control signal is a signal going to 1 when the clock pulse has a rising edge upon a time interval u31 during which the clock signal is desired to be stopped [see a waveform diagram shown at (a) in FIG. 6(B)]. The control signal stays in 0 otherwise.

The OR gate 55 creates a logical add of the aforesaid inverted input clock signal [see the waveform diagram shown at (b) in FIG. 6(B)] and the signal from the latch 53 [see a waveform diagram shown at (d) in FIG. 6(B)]. Thus, the output clock signal can be controlled in a desired manner [see a waveform diagram shown at (e) in FIG. 6(B)]. In this way, similarly to the case of [3], when the control signal goes to the high level to designate an interval (the interval between timing points t31 and t32), the clock signal supply can be stopped, with the result that the pulse of the input clock signal taking the high level during a time period u31 is prevented from being outputted.

While in the above examples of FIGS. 4(A) to 6(A) the control signal is introduced in a non-inversion state so as to effect an active high control, the control signal may be introduced in an inverted state to effect an active low control. Further, in either of the modes of the active high control and active low control, the value of the control signal may be arrange to take a value of power supply line of GND or Vcc (always 0 or always 1) so that the clock is constantly supplied unless the clock supply stop mode is effected. Thus, there is no necessity to additionally prepare wiring resources, and hence the wiring resources can be effectively utilized.

Further, as described above, each of the clock supply line constituting the clock net 4 is arranged to have branches in a multiple stage manner (in the case of FIG. 1, there are four branch stages), and each of the switching circuits 5, 5-1 to 5-4 is provided on the clock supply line constituting the clock net 4 at a point just behind the branch of the clock supply line as viewed from the upstream side of the clock supply stream. In this case, of the switching circuits 5, 5-1 to 5-4, the switching circuit disposed on the downstream side (e.g., the switching circuit 5-4 on the downstream side with respect to the switching circuit 5-3 shown in FIG. 7) of the clock net 4 may be arranged to have the AND gate 51 as in the example of FIG. 3(A). Alternatively, the same switching circuit disposed on the downstream side may be arranged to have the OR gate 52 as in the example of FIG. 4(A). Therefore, the switching circuit of the arrangement of the example of FIG. 3(A) or the example of FIG. 4(A) can be supplied with a control signal from a logic block 1 which is disposed near the switching circuit as a target of control. Accordingly, a propagation delay due to the wiring length can be effectively avoided and the circuit size can be effectively suppressed.

Figure 7:
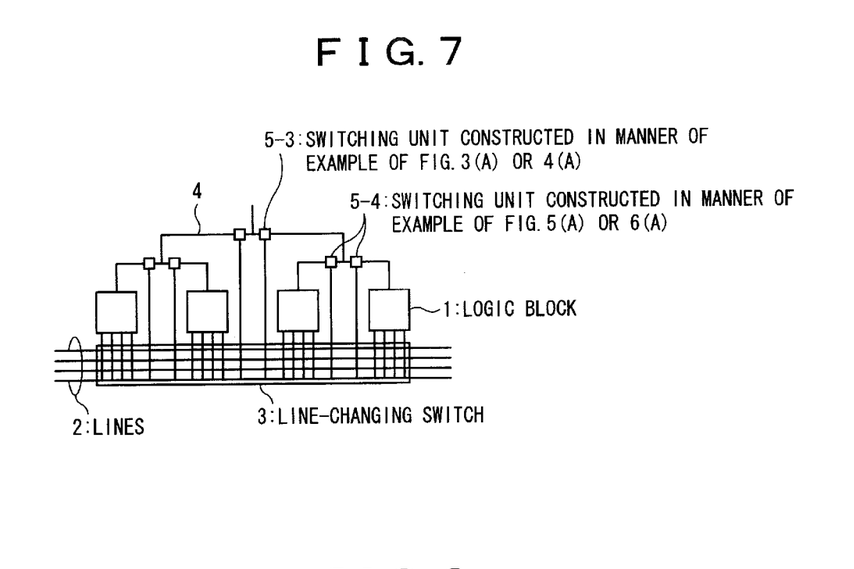
FIG. 7 is a circuit diagram showing a main portion of the FPGA shown in FIG. 1.

Further, the switching circuit disposed on the relatively upstream side (e.g., the switching circuit 5-3 on the upstream side with respect to the switching circuit 5-4 shown in FIG. 7) of the clock net 4 may be arranged to have the latch 53 and the AND gate 54 as in the example of FIG. 5(A). Alternatively, the same switching circuit disposed on the upstream side may be arranged to have the latch 53 and the OR gate 55 as in the example of FIG. 6(A). The arrangement of the switching circuit of the example of FIG. 5(A) or the example of FIG. 6(A) becomes more tolerable of a propagation delay due to the wiring length for the control signal as compared with the arrangement of the switching circuit of the example of FIG. 3(A) or the example of FIG. 4(A). Therefore, wiring of a longer distance becomes permissible for the control signal as compared with the case of FIG. 3(A) or FIG. 4(A). Accordingly, the switching circuit of the arrangement of the example of FIG. 5(A) or the example of FIG. 6(A) can be supplied with the control signal from a logic block 1 which is relatively distant from the switching circuit as a target of control, which fact leads to a freedom upon designing the circuits.

The lines 2 for supplying the control signal from the logic block 1 to each of the switching circuits 5, 5-1 to 5-4 may often serve as a wiring for control something together with the clock. If the control signal is arranged to have a polarity or property which allows a cohabitation in this wiring with a signal for control something other than the clock, the wiring resources will be more effectively utilized.

According to the arrangement of the FPGA 10 of the first embodiment of the present invention, the switching circuits 5, 5-1, 5-4 are controlled in a manner as follows. That is, of the 16 logic blocks 1 (see FIG. 1), a control signal for bringing the logic block 1 into the clock signal supply mode is supplied to a logic block 1 in an active mode (enable state), whereby the input clock signal is supplied from a clock supply source not shown to the logic block 1 in the active mode. Conversely, a control signal for bringing the logic block into the clock signal stop mode is supplied to a logic block 1 in a non-active mode (disable state), whereby the input clock signal is prevented from being supplied to the logic block 1 in the non-active mode.

The same manner of controlling the switching circuits 5, 5-1, 5-4 can be described from a standpoint of a predetermined logic block 1. That is, the predetermined logic block 1 generates the control signal (stop control signal) for stopping the clock signal from being supplied to a logic block 1 placed in the non-active state which is selected from the 16 logic blocks 1 (control signal generating step). In response to the stop control signal, each of the switching circuits 5, 5-1, 5-4, which is arranged based on any of the examples of [1] to [4], is activated so that the clock signal is prevented from being supplied to the logic block 1 placed in the non-active state (clock signal supply halting step). In this way, if there is a logic block 1 placed in the non-active state out of the logic blocks 1 provided within the FPGA 10, the clock signal supply to the logic block 1 placed in the non-active state is dynamically stopped. Accordingly, electric power consumption or heat generation as the whole circuit arrangement can be decreased.

As described above, according to the arrangement of the FPGA as the first embodiment of the present invention, each of the switching circuits 5, 5-1 to 5-4 can dynamically control each logic block 1 in switching between the clock signal supply mode and the clock signal stop mode so that the clock signal is prohibited from being supplied to any of the 16 logic blocks 1 placed in the non-active state. Accordingly, electric power consumption or heat generation as the whole circuit arrangement can be decreased.

Further, the plurality of switching circuits 5, 5-1 to 5-4 are fixedly disposed just behind the corresponding branch point of the clock supply line forming the clock net 4. Therefore, this arrangement of the clock supply line can be free from a problem of clock signal skew, and components including an existing buffer disposed on the clock net 4 can be properly controlled in switching between the clock supply mode and clock stop mode. Furthermore, according to the arrangement of the present invention, the control signal for each switching circuit is supplied from a corresponding logic block 1 through the lines 2. Therefore, each logic block 1 can be controlled in switching between the clock supply mode and clock stop mode depending on the state of operation of the logic block 1. Thus, each logic block 1 can be controlled with ease and large freedom will be brought into the situation of designing the property of control.

Further, according to the arrangement of the present invention, each of the switching circuits 5, 5-1 to 5-4 is properly arranged based on any of the examples of [1] to [4] depending on the location of the switching circuit, i.e., whether the switching circuit is disposed on the upstream side or downstream side with respect to another on the clock net 4. That is, the switching circuits 5, 5-1 to 5-4 are differently arranged based on any of the examples of [1] to [4]. Therefore, it is guaranteed that the switching circuits can be properly operated depending on the location of the clock net 4, the circuit size increase deriving from the switching circuits 5, 5-1 to 5-4 can be suppressed to the minimum, and even if the chip size becomes large, the control of switching between the clock supply mode and clock stop mode can be effected with stability.

In more concretely, according to the arrangement of the present invention, if there is any switching circuit on the downstream side with respect to a switching circuit which is set to the clock supply stop mode, the switching circuit disposed on the downstream side is inevitably set to the clock signal supply mode. Therefore, a control signal of an active state may be supplied to only the upstream side switching circuit which governs all of the logic blocks 1 which are desired to be set to the clock signal stop mode. Accordingly, a plurality of logic blocks 1 disposed on the downstream side can be collectively controlled in their clock control by providing a single supply of control signal, the switching circuits disposed on the downstream side need not be supplied with a control signal which brings the switching circuit into the active state, and hence the control becomes easy, and a circuit portion utilized for clock control can be decreased.

The switching circuits 5, 5-1 to 5-4 may be arranged based on the example shown in FIG. 3(A) which is formed of only the AND gate 51. Alternatively, the switching circuits 5, 5-1 to 5-4 may be arranged based on the example shown in FIG. 4(A) which is formed of only the NOR gate 52. In either cases, the circuit size thereof can be suppressed to the minimum necessity and the chip size thereof can be made small, which makes it possible to suppress the cost of circuits. Furthermore, an area on a board requested when the chip is mounted thereon can be made small.

The switching circuits 5, 5-1 to 5-4 may be arranged based on the example shown in FIG. 5(A) which is formed of the latch 53 and the AND gate 54. Alternatively, the switching circuits 5, 5-1 to 5-4 may be arranged based on the example shown in FIG. 6(A) which is formed of the latch 53 and the NOR gate 55. With these arrangements, the control signal is requested to go 1 only at the rising edge portion of the clock signal for stopping the clock signal. Therefore, the control signal will be less restricted upon forming the signal, which makes it easy to design the relevant circuit arrangements, and circuit performance will be improved.

Of these switching circuits 5, 5-1 to 5-4, the switching circuits disposed at a relatively downstream portion of the clock net 4 are arranged in the manner of above-described examples [1] or [2]. That is, each of the switching circuits on the downstream side is formed of the AND gate 51 which creates a logical product of the control signal and the clock signal and supplies the product to the side of logic block 1. Alternatively, each of the switching circuits on the downstream side is formed of the NOR gate 52 which creates a logical add and outputs the add to the side of logic block 1. Further, each of the switching circuits are made to be supplied with the control signal from a logic block 1 which is provided near the switching circuit as a target of control. With this arrangement, the delay of signal due to the length of wiring can be avoided.

Of these switching circuits 5, 5-1 to 5-4, the switching circuits disposed at a relatively upstream portion of the clock net 4 are arranged in the manner of above-described examples [3] or [4]. That is, each of the switching circuits on the downstream side is formed of the latch 53 which effects a latching action in response to the control signal and the clock signal and the AND gate 54 which creates a logical product of the output of the latch 53 and the clock signal and supplies the product to the side of the logic block 1. Alternatively, each of the switching circuits on the downstream side is formed of the latch 53 which effects a latching action in response to the control signal and the clock signal and the NOR gate 55 which creates a logical add of an output of the latch 53 and the clock signal and outputs the add to the side of the logic block 1. With these arrangement, the circuit operation will be effected with stability. Thus, these circuit arrangements are more tolerable of the delay of the control signal due to the wiring length as compared with the cases of the above-described examples [1] and [2]. Therefore, the lines for the control signal are allowed to be long, and hence the switching circuit can be supplied with the control signal from a logic block 1 which is remote from the switching circuit as a target of control, which fact brings more freedom into a situation of designing the circuit.

In other words, if the switching circuit is disposed at a relatively upstream portion of the clock net and the switching circuit governs a wide area including many logic blocks 1 and controls them collectively in switching between the clock signal supply mode and clock signal stop mode, the switching circuit disposed at the relatively upstream portion of the clock net is formed of the latch 53 and the AND gate 54 or the NOR gate 55. Therefore, even if the switching circuit is supplied with the control signal from the logic block 1 remote from the switching circuit, the switching circuit can be operated with stability. Conversely, if the switching circuit is disposed at a relatively downstream portion of the clock net and the switching circuit governs a small area including a small number of logic blocks 1, the switching circuit is formed of the AND gate 51 or the NOR gate 52. With this arrangement, it becomes possible to suppress the circuit size increase.

[2] Other Disclosure

While in the embodiments of the present invention description has been made on the FPGA having 16 logic blocks forming a matrix array of the logic blocks, the present invention can be applied to another type of FPGA having several number of logic blocks.

While in the embodiments of the present invention description has been made in detail on a case in which the present invention is applied to the FPGA, the present invention is not limited thereto. That is, it is needless to say that the present invention can be applied to a programmable logic device other than the FPGA, e.g., a programmable logic device such as a CPLD.

While there is difference between the arrangement of the FPGA and that of the CPLD, both of them share a common arrangements. That is, both of the FPGA and the CPLD are formed of logic blocks, lines connecting the logic blocks one another, and line-changing switch as means for changing lines. Further, the FPGA and the CPLD include a clock signal net as lines which is provided for supplying a clock signal independently of the lines connecting the logic blocks. Therefore, the present invention is not particularly applied to the FPGA but can be widely applied to another type of programmable logic device such as the CPLD to implement a logic device without introducing great modification into the design concept of the device.

While in the embodiment of the present invention description has been made in detail on the switching circuit arranged based on any of the aforesaid four examples, the present invention will not be limited thereto, but the switching circuit can be formed of any other known circuit elements.

While several embodiments and modifications have been described above, various changes and modifications thereof can be effected without departing from the gist of the present invention.

The programmable logic device according to the present invention can be manufactured based on the above-disclosed embodiments.

What is claimed is:

1. A programmable logic device comprising:

a plurality of logic blocks for carrying out logical operation;

lines for connecting the logic blocks to one another;

line-changing means for changing the state of lines connecting the logic blocks to one another by programming;

a clock net for supplying a clock signal for controlling an operation timing to each of the logic blocks, the clock net being provided independently of the lines, and one end of said clock net being a single channel of a clock supply line and the other end of said clock net being branched at a plurality of stages; and clock control means for dynamically controlling switching between a clock signal supply mode and a clock signal stop mode for each logic block so that at least one non-active logic block of said plurality of logic blocks, which shifts from an active state to a non-active state, can be stopped from being supplied with the closing signal;

wherein the clock control means is composed of a plurality of switching units, each provided just after a branched position at the plural respective stages on said clock net.

2. A programmable logic device according to claim 1, wherein, when at least one of said plurality of switching units, which is stopped from being supplied with the clock signal, exists and at least one of said plurality of switching units exists on a downstream side of the switch unit in the clock signal stop mode, the switching unit on the downstream side is placed in the clock signal supply mode.

3. A programmable logic device according to claim 1, wherein the clock control means is arranged to carry out switching between the clock signal supply mode and the clock signal stop mode in accordance with a control signal supplied from a predetermined one of said plurality of logic blocks.

4. A programmable logic device according to claim 3, wherein the clock control means is arranged to receive the control signal through the lines and the line-changing means.

5. A programmable logic device according to claim 3, wherein each of the switching units is arranged to have an AND gate which creates a logical product of the control signal and the clock signal and outputs the product to the side of the logic block.

6. A programmable logic device according to claim 3, wherein each of the switching units is arranged to have an OR gate which creates a logical add of the control signal and the clock signal and outputs the add to the side of the logic block.

7. A programmable logic device according to claim 3, wherein each of the switching units is arranged to have a latch which effects a latching action in response to the control signal and the clock signal and an AND gate which creates a logical product of an output of the latch and the clock signal and outputs the product to the side of the logic block.

8. A programmable logic device according to claim 3, wherein each of the switching units is arranged to have a latch which effects a latching action in response to the control signal and the clock signal and an OR gate which creates a logical add of an output of the latch and the clock signal and outputs the add to the side of the logic block.

9. A programmable logic device according to claim 3, wherein at least one of said plurality of switching units, which is disposed within an area of a downstream side of the clock net, is arranged to have an AND gate or an OR gate which generates a logical product or a logical add of the control signal and the clock signal and outputs the product or the add to the side of the logic block, and at least one of the said plurality of switching units, which is disposed within an area of an upstream side of the clock net, is arranged to have a latch which effects a latching action in accordance with the control signal and the clock signal and an AND gate or an OR gate which generates a logical product or a logical add of an output of the latch and the clock signal and outputs the product or the add to the side of the logic block.

10. A programmable logic device according to claim 1, wherein the clock control means is arranged to carry out switching between the clock signal supply mode and the clock signal stop mode in accordance with a control signal supplied from a predetermined one of said plurality of logic blocks.

11. A programmable logic device according to claim 10, wherein the clock control means is arranged to receive the control signal through the lines and the line-changing means.

12. A programmable logic device according to claim 1, wherein each of the logic blocks is arranged to include an element which operates in synchronism with the clock signal.

13. A method of controlling a clock signal to be supplied to a programmable logic device comprising a plurality of logic blocks for carrying out logical operation, lines for connecting the logic blocks to one another, line-changing means for changing the state of lines connecting the logic blocks to one another by programming, and a clock net for supplying a clock signal for controlling an operation timing to each of the logic blocks, the clock net being provided independently of the lines, one end of said clock net being a single channel of clock supply line and the other end of said clock net being branched at a plurality of stages, and a plurality of switching units each provided just after a branched position at the plural respective stages on said clock net; the method comprising steps of:

outputting a control signal to one of said switching units so that at least one non-active logic block of said plurality of logic blocks, which shifts from an active state to a non-active state, can be stopped from being supplied with the clock signal; and halting the clock signal supply to the non-active logic block connected to said clock net downstream of one of said switching units to which the control signal is outputted, in accordance with the controls signal which is generated at the outputting step.

14. A method according to claim 13, wherein the programmable logic device is an FPGA (Field Programmable Gate Array).

15. A method according to claim 13, wherein the programmable logic device is a CPLD (Complex Programmable Logic Device).

16. A programmable logic device comprising:

a plurality of logic blocks for carrying out logical operation;

lines for connecting the logic blocks to one another;

line-changing means for changing the state of lines connecting the logic blocks to one another by programming;

a clock net for supplying a clock signal for controlling an operation timing to each of the logic blocks, the clock net being provided independently of the lines;

clock control means for dynamically controlling switching between a clock signal supply mode and a clock signal stop mode for each logic block so that at least one non-active logic block of said plurality of logic blocks, which shifts from an active state from a non-active state, can be stopped from being supplied with the clock signal;

wherein the clock control means is composed of a plurality of switching units, provided on the clock net, for switching between the clock signal supply mode and the clock signal stop mode;

wherein the clock control means is arranged to carry out switching between the clock signal supply mode and the clock signal stop mode in accordance with a control signal supplied from a predetermined one of said plurality of logic blocks; and wherein each of the switching units is arranged to have a latch which effects a latching action in response to the control signal and the clock signal and an AND gate which creates a logical product of an output of the latch and the clock signal and outputs the product to the side of the logic block.

17. A programmable logic device comprising:

a plurality of logic blocks for carrying out logical operation;

lines for connecting the logic blocks to one another;

line-changing means for changing the state of lines connecting the logic blocks to one another by programming;

a clock net for supplying a clock signal for controlling an operation timing to each of the logic blocks, the clock net being provided independently of the lines;

clock control means for dynamically controlling switching between a clock signal supply mode and a clock signal stop mode for each logic block so that at least one non-active logic block of said plurality of logic blocks, which shifts from an active state from a non-active state, can be stopped from being supplied with the clock signal;

wherein the clock control means is composed of a plurality of switching units, provided on the clock net, for switching between the clock signal supply mode and the clock signal stop mode;

wherein the clock control means is arranged to carry out switching between the clock signal supply mode and the clock signal stop mode in accordance with a control signal supplied from a predetermined one of said plurality of logic blocks; and wherein each of the switching units is arranged to have a latch which effects a latching action in response to the control signal and the clock signal and an OR gate which creates a logical add of an output of the latch and the clock signal and outputs the add to the side of the logic block.

18. A programmable logic device comprising:

a plurality of logic blocks for carrying out logical operation;

lines for connecting the logic blocks to one another;

line-changing means for changing the state of lines connecting the logic blocks to one another by programming;

a clock net for supplying a clock signal for controlling an operation timing to each of the logic blocks, the clock net being provided independently of the lines;

clock control means for dynamically controlling switching between a clock signal supply mode and a clock signal stop mode for each logic block so that at least one non-active logic block of said plurality of logic blocks, which shifts from an active state from a non-active state, can be stopped from being supplied with the clock signal;

wherein the clock control means is composed of a plurality of switching units, provided on the clock net, for switching between the clock signal supply mode and the clock signal stop mode;

wherein the clock control means is arranged to carry out switching between the clock signal supply mode and the clock signal stop mode in accordance with a control signal supplied from a predetermined one of said plurality of logic blocks;

wherein at least one of said plurality of switching units, which is disposed within an area of a downstream side of the clock net, is arranged to have an AND gate or an OR gate which generates a logical product or a logical add of the control signal and the clock signal and outputs the product or the add to the side of the logic block, and at least one of said plurality of switching units, which is disposed within an area of an upstream side of the clock net, is arranged to have a latch which effects a latching action in accordance with the control signal and the clock signal and an AND gate or an OR gate which generates a logical product or a logical add of an output of the latch and the clock signal and outputs the product or the add to the side of the logic block.

* * * * *